United States Patent [19]

Dreiling

[11] Patent Number: 4,466,992

[45] Date of Patent: Aug. 21, 1984

[54] HEALING PINHOLE DEFECTS IN AMORPHOUS SILICON FILMS

[75] Inventor: Mark J. Dreiling, Bartlesville, Okla.

[73] Assignee: Phillips Petroleum Company, Bartlesville, Okla.

[21] Appl. No.: 383,372

[22] Filed: May 28, 1982

[51] Int. Cl.³ ............................................. B05D 3/06
[52] U.S. Cl. .................................... 427/39; 427/54.1; 427/74; 427/140; 427/255.1
[58] Field of Search .................. 427/53.1, 38, 54.1, 427/142, 75, 140, 248.1, 255, 255.1, 39

[56] References Cited

U.S. PATENT DOCUMENTS

| | | | |
|---|---|---|---|
| 4,123,989 | 11/1978 | Jewett | 118/49.5 |
| 4,181,751 | 1/1980 | Hall et al. | 427/53.1 |
| 4,217,374 | 8/1980 | Ovshinsky et al. | 427/39 |

FOREIGN PATENT DOCUMENTS

WO81/03628 12/1981 PCT Int'l Appl. ................ 427/53.1

*Primary Examiner*—Evan K. Lawrence

[57] ABSTRACT

A method for healing physical defects in semiconductive films is described. A transparent substrate and semiconductive film are passed to a vacuum chamber in which the film layer is contacted with an activating vapor such as mercury and a depositing vapor such as silane while light is passed through the transparent substrate from the side opposite the film and into the vacuum chamber through any defects in the film. The light activates the mercury vapor and deposits silicon hydride in the defect areas, thus providing a physically healed semiconductive film.

27 Claims, 3 Drawing Figures

HEALING PINHOLE DEFECTS IN AMORPHOUS SILICON FILMS

BACKGROUND OF THE INVENTION

The invention relates to the healing of gaps in a film with a substance which can be deposited by photochemical methods.

The invention also relates to photovoltaic cells.

In one embodiment, the invention relates to the repair of defects in the amorphous silicon film layer of a photovoltaic cell.

A considerable amount of current research in the energy industry involves the conversion of the energy of the sun into usable electrical energy. It is known that crystalline materials such as silicon possess properties which enable the efficient conversion of sunlight to electrical energy. However, pure crystalline forms of silicon are extremely costly and are not feasible for most uses.

It is known that amorphous silicon- or germanium-containing films can be used in photovoltaic cells for the conversion of sunlight energy into electrical energy. Deposited amorphous silicon or germanium, however, is subject to the problem of microvoids and other defects such as pinholes, at which no material is deposited. In semiconductor cells having a metallic layer applied over the semiconducting layer, the pinhole can provide a site for the metal to contact the substrate, resulting in a localized electrical short and low conversion efficiency.

Methods for depositing an amorphous silicon film on a substrate have been developed to minimize the problem of pinhole defects. For example, glow discharge deposition is a method in which silane ($SiH_4$) gas is passed through an evacuated reaction tube in which the silane is decomposed by a radio frequency glow discharge and deposited on a substrate at high substrate temperature. In another method of amorphous silicon deposition, called sputter deposition, an amorphous silicon film is deposited on a substrate in an argon and hydrogen atmosphere. It has been found that, because these methods leave localized film gaps, the resulting amorphous silicon film does not permit conversion of sunlight to electrical energy with sufficient efficiency to be economically feasible.

It is therefore an object of the present invention to provide an improved photovoltaic cell. It is a further object to provide a method for healing defects in amorphous semiconductor films.

SUMMARY OF THE INVENTION

According to the invention, defects in a semiconductor film on a light-transmitting substrate are healed by a process in which light is transmitted through the substrate and then through the defect into an atmosphere containing a gas which is deposited, directly or indirectly, by photochemical means. The film can be exposed to an atmosphere comprising an activating gas and a depositing gas, the activating gas acting to transfer energy absorbed from the transmitted light to the depositing gas, causing the depositing gas or a decomposition product thereof to be deposited in the pinholes. In a specific embodiment, pinhole defects in a photovoltaic cell of amorphous semiconducting film deposited on a light-transmitting substrate are healed by exposing the film to a low-pressure atmosphere containing mercury vapor and a gaseous depositing material, and passing light into the chamber through the pinholes under conditions suitable for the sensitization of the mercury and the resulting deposition of the gaseous material or a decomposition product thereof in the pinholes. The resulting "patched" pinholes are no longer sites at which a subsequently-applied layer of metal can penetrate to the substrate and cause a localized electrical short.

DETAILED DESCRIPTION OF THE INVENTION

Figure 1:
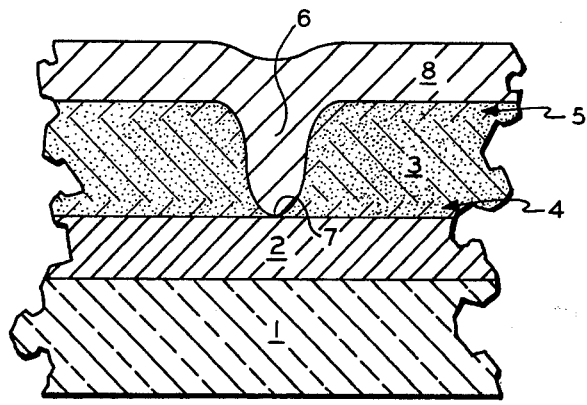
FIG. 1 is a fragmentary sectional view of an example of a photovoltaic cell having a pinhole defect.

The invention method can be used to repair defects in any film positioned on a light-transmitting substrate. The invention method is particularly suited for repairing pinhole defects in semiconducting films deposited on a rigid, light-transmitting substrate.

Any substrate-backed film can be repaired by the invention method of photochemical healing. The process is particularly suited for healing pinhole defects in semiconducting films made from semiconductive materials. Such materials include silicon and germanium. The film can be deposited on a substrate by any suitable method including, for example, vapor deposition, sputtering, silane decomposition, ionization and radio frequency methods. The film should not be transparent to the activating wavelengths of light used in the healing method.

The thickness of the film to be repaired is not critical. For most uses, films of semiconductive materials will range in thickness from about $10^{-6}$ to about $10^{-2}$ mm. For use in a photovoltaic cell, such semiconductive films will generally range in thickness from about $10^{-5}$ to about $10^{-3}$ mm.

The defects which are cured must be characterized by an ability to transmit light, since it is the light which targets the area for deposition of the healing material and provides the energy necessary for its deposition. Thus, the defects can be holes in the film which penetrate to the substrate or, if the film material is light-transmitting at thicknesses less than the general thickness of the film, the defects can be depressed areas having a thickness markedly less than that of the overall film.

The healing process results in the deposition of material in the defect, but does not necessarily fill the depression so as to make the semiconducting film perfectly continuous. The purpose of the healing process as applied to photovoltaic cells is to eliminate areas of contact between the substrate and a metallic layer deposited over the semiconducting layer. Thus, any amount of material separating the substrate from the conductive metal achieves the purpose of preventing localized electrical shorts. As a by-product of the at least partial filling-in of the pinhole, the outer surface of the cell will be more uniform, although as explained above, this is not the purpose of the invention as applied to photovoltaic cell manufacture.

The substrate can be any substrate which will transmit light having a wavelength effective for promoting the deposition of the healing material. The substrate used in a particular instance will depend upon the ultimate use of the article and upon the specific film repair method used. Examples of light-transmitting substrates include quartz, glass, transparent synthetic polymeric materials such as polyethylene, polypropylene and polyphenylene sulfide, and the like. For use in the photochemical deposition of silicon hydride or germanium hydride discussed below, the preferred substrate material is quartz because of its ability to transmit light of the necessary wavelengths.

The invention method involves the photodeposition of a substance in defects in a film on a light-transmitting substrate by transmitting light through the substrate and then through the defects so as to cause deposition of the healing material at the points marked by the transmitted light.

The invention method can employ any technique for light-induced deposition of a material on a substrate. One such method involves the use of a gaseous activating substance mixed with a gaseous depositing substance. When the activating substance is exposed to light energy, it is raised to a higher energy state. The activating substance transfers energy to the depositing substance, causing it to be transformed to a material which condenses on an exposed surface of the substrate. The process is carried out under a vacuum, at pressures generally less than about 40 torr, although higher pressures are acceptable.

Such a process could be carried out, for example, in a vacuum chamber containing a mixture of mercury gas and silane maintained at a pressure of about 10 to about 40 torr. The light-transmitting substrate having a film layer on one side is positioned so that the film layer is exposed to the mercury-silane atmosphere. A light effective for the activation of the mercury gas is directed toward the uncoated side of the substrate and is transmitted into the chamber through the pinholes. The light entering through the pinholes causes deposition of the decomposition products of silane, including silicon hydride, in the pinholes.

In such a method, the depositing substance can be any gaseous material which is subject to light-induced decomposition and condensation on a substrate. Such substances include, for example, silane and germane, which are subject to mercury-induced decomposition to the hydride and subsequent condensation on a substrate. When used to repair defects in a photovoltaic cell, the deposited material should not be highly conductive.

The light source used in the invention method is one which produces light having a wavelength corresponding to the atomic absorption lines of the sensitizing substance. For mercury vapor, it is preferred to use an ultraviolet light source having a wavelength of from about 200 to about 320, preferably about 254 nm. For ultraviolet light, the preferred light-transmitting substrate material is quartz.

In the invention pinhole-healing method, the light is directed at the side of the substrate which is opposite the film. The light is passed through the light-transmitting substrate and is transmitted into the gaseous atmosphere via any pinholes in the film. As the light energizes the mercury vapor in its path, the depositing substance is deposited onto the sunstrate at the pinhole sites to produce a healed film. The material thus deposited will generally not be as thick as the film itself, as the depositing process at a pinhole will continue only so long as light is transmitted through that pinhole. The healed portion will thus usually be less than about 1000 Å in width, generally about 200–300 Å, but any size which prevents contact with the substrate is acceptable. The process continues until the film is transitting essentially no light, indicating the repair of the majority of pinholes of significant size.

The healing process is carried out at a pressure of generally less than 1 atmosphere, preferably about 10 to about 40 torr and a temperature of room temperature or higher, preferably about 60° to 150° F. The substrate temperature during the healing process is not critical.

The healing process can generally be completed in a time of about 30 seconds to about 10 minutes but may be continued for longer if conditions require.

The pinhole will generally after healing continue to be a "dead area" of a photovoltaic cell, but it will not be a site for an electrical short caused by metal-substrate contact.

An example of an amorphous silicon photovoltaic cell which can be treated by the invention method is shown schematically in FIG. 1. Layer 1 is a light-transmitting substrate such as quartz or glass generally about 1/10–⅛ inch wide. Indium/tin oxide layer 2 is a transparent conductive coating about 100 to about 3000 Å thick, between substrate 1 and amorphous silicon layer 3. The amorphous silicon layer is generally about 1000 Å thick and includes p-doped layer 4 of a material such as silicon hydride containing boron, an intermediate intrinsic (non-doped) silicon hydride layer, and n-doped layer 5 of a material such as silicon hydride containing phosphorus.

Pinhole area 6 extends through amorphous silicon area 3 so as to expose a portion of conductive layer 2 at 7. In order to prevent contact between layer 8, which is generally a metal such as aluminum, the invention process can be used to deposit healing substance 9, which can be amorphous silicon or germanium, for example, between the two layers so as to prevent contact between these layers.

Figure 2:
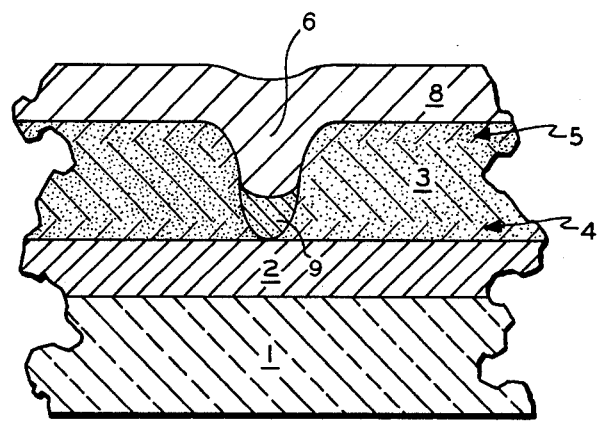
FIG. 2 is a fragmentary sectional view of the photovoltaic cell of FIG. 1 after healing by light-induced deposition according to the invention method.

The pinhole defect is shown in FIGS. 1 and 2 for illustration purposes to extend through the entire amorphous silicon layer. It is possible that, if the pinhole formed during the deposition of the p-doped layer, the healing process could be carried out prior to deposition of the intrinsic layer and the n-doped layer. That is, the healing process can be carried out after any layer or portion of it has been applied and contains pinhole defects, so long as the underlying layers are capable of transmitting light.

Figure 3:
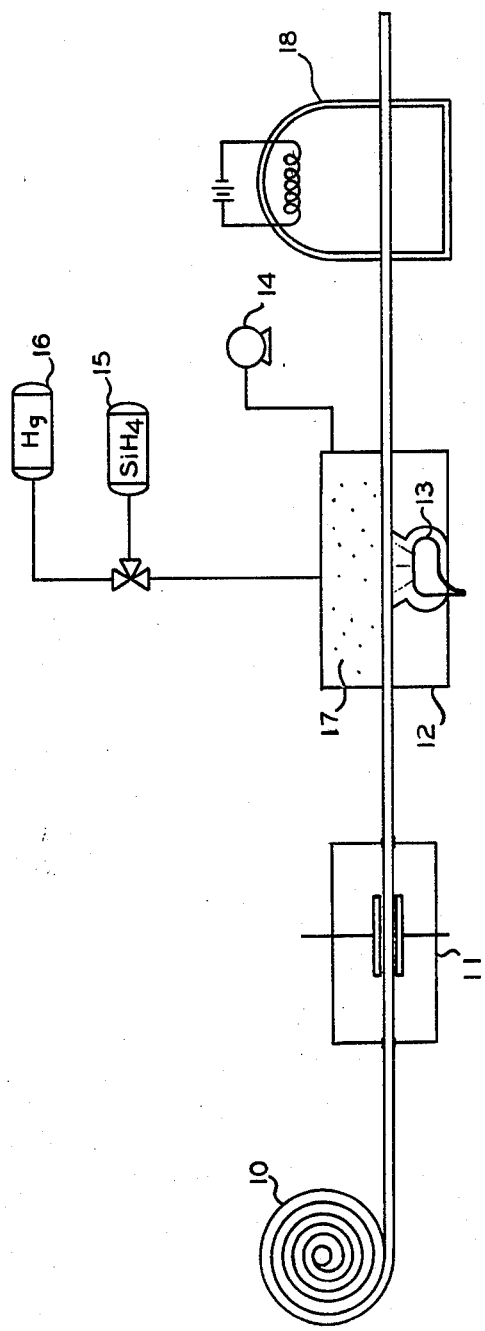
FIG. 3 is a schematic diagram of a process for preparing an article comprising a semiconducting film on a substrate employing the present invention.

FIG. 3 illustrates schematicallyy a process of manufacturing amorphous silicon photovoltaic cells using the invention healing method. In the process shown, sheet 10 of a light-transmitting laminate comprising an indium/tin oxide layer on a quartz or thin glass substrate is passed to deposition zone 11 in which amorphous silicon hydride is deposited on the indium/tin oxide layer by a method known in the art such as plasma deposition. A suitable plasma deposition method could be performed at a substrate temperature from about 200° to about 300° C., a pressure of about 0.2 to about 1 torr, 50 cc/min flow of approximately 10% silane and 90% mercury and radio frequency power of about 20 to about 100 watts. Although step 11 is illustrated schematically as one step, in practice there may be separate processes for application of the p-doped, intrinsic and n-doped layers of amorphous silicon.

The amorphous silicon film and substrate are then passed to healing zone 12 having vacuum pump 14 and sources of silane 15 and mercury 16. The film-containing substrate is passed into vacuum chamber 17 containing mercury vapor and silane gas, and ultraviolet light from light source 13 is transmitted through the substrate and indium/tin oxide layer into the mercury vapor, resulting in deposition of silicon hydrides in the pinholes.

The substrate is then passed to zone 18 where a layer of a metal such as aluminum is vacuum-deposited over the amorphous silicon layer, and the finished cell is then passed to finishing and applications.

EXAMPLE I

This experimental run was performed in order to show that a defect in a silicon thin film could be healed by the invention method. The run was performed using vacuum apparatus consisting of a Welch 1405 fore pump run at a rate of about 60 liters/minute and an oil diffusion pump operated at a rate of about 30 liters/sec at $10^{-4}$ torr and containing a liquid nitrogen cold trap for mercury. A quartz vessel containing a drop of mercury provided a vacuum deposition chamber for the healing of the cell. A quartz window was positioned within the vessel so as to face a low-pressure mercury lamp connected to a high-voltage source. The distance between the light source and the quartz window was about 1.0 cm.

The quartz window had been previously prepared by depositing amorphous silicon to a thickness of about 300 Å by mercury photosensitized decomposition of $SiH_4$. In the deposition, 10 torr of silane was irradiated for one hour at 25° C. in the presence of mercury vapor using a low-pressure mercury lamp. The thus-treated quartz window was removed and an "X" about 15 mm in height was scratched into the silicon surface using a glass rod. The vessel was then reassembled with the amorphous silicon side having the "X" scratch facing the interior of the vessel and exposed to the mercury/silane atmosphere.

The vacuum line was again attached and a residual pressure of $10^{31\ 4}$ torr was obtained. Ten torr of the silane healing gas was introduced into the vessel, and the vessel was closed. The filled reactionn vessel was detached from the vacuum pump, and the reaction vessel was irradiated for one hour using the mercury lamp. The excess silane and reaction products were evacuated and the vessel was vented.

The quartz window was examined. A distinct difference in the optical density of the amorphous silicon in the scratched area as compared with the unscratched area was observed.

A similar run was performed using germanium tetrahydride as the healing gas for an amorphous silicon film. The healed area of the quartz window was marked by the dark-brown color of amorphous germanium.

I claim:

1. A method for healing defects in the film layer of a laminate comprising a film on a light-transmitting substrate, the method comprising
   exposing the film layer to an atmosphere comprising a gas which is subject to light-induced deposition as a solid on a substrate, the exposure carried out under conditions suitable for light-induced deposition of the gas or a decomposition product of it as the solid on the substrate, and
   directing, through the light-transmitting substrate and then through the defects in the film into the atmosphere, light having a wavelength effective for inducing deposition of the gas or the decomposition product of it as the solid in the defects.

2. The method of claim 1 in which the atmosphere comprises an activating gas and a depositing gas, the activating gas being capable of transferring energy absorbed from light to the depositing gas, thereby inducing deposition of the gas or a decomposition product of it as a solid in the film defects.

3. The method of claim 2 in which the activating gas is mercury vapor.

4. The method of claim 2 in which the film comprises a semiconductive material.

5. The method of claim 4 in which the substrate is quartz.

6. The method of claim 5 in which the light is ultraviolet light.

7. The method of claim 6 in which the conditions under which the film is exposed to the atmosphere include a pressure of about 10 torr to about 40 torr.

8. The method of claim 6 in which the depositing gas is selected from the group consisting of silane and germane.

9. The method of claim 8 in which the film is selected from the group consisting of amorphous silicon and amorphous germanium.

10. The method of claim 9 which further comprises applying a metallic layer on the thus-healed film layer.

11. A process for healing defects in a semiconducting film in a photovoltaic cell comprising the semiconducting film and a light-transmitting substrate, the process comprising
    exposing the film layer to a low-pressure environment comprising an activating vapor and a depositing vapor under conditions suitable for deposition of the depositing vapor or a decomposition product of it as a solid upon activation of the activating vapor by light energy,
    exposing the light-transmitting substrate to a light source effective for activating the activating vapor so as to transmit light through the substrate and through the defects in the semiconducting film into the low-pressure environment, thereupon activating the activating vapor and depositing the depositing vapor or a decomposition product of it as a solid in the defect.

12. The process of claim 11 in which the activating vapor is mercury.

13. The process of claim 12 in which the environment is at a pressure of about 10 torr to about 40 torr.

14. The process of claim 13 in which the depositing vapor is selected from the group consisting of silicon hydrides and germanium hydrides.

15. The process of claim 13 in which the light is ultraviolet light.

16. The process of claim 13 in which the substrate is quartz.

17. The process of claim 16 in which the semiconducting film is selected from the group consisting of amorphous silicon hydride and amorphous germanium hydride.

18. The process of claim 17 in which the semiconducting film is doped.

19. The process of claim 18 in which the photovoltaic cell further comprises a transparent, conductive layer between the quartz substrate and the semiconducting film.

20. The process of claim 19 in which the transparent conductive layer comprises indium and tin oxide.

21. A process for the manufacture of a photovoltaic cell comprising the steps of:
depositing a semiconductive film having surface defects on a light-transmitting substrate to produce a laminate;
passing the laminate to a vacuum chamber containing mercury vapor and a depositing material which is subject to mercury-induced deposition, the laminate being positioned so that the semiconductive film is contacted by the mercury vapor;
passing mercury-activating wavelengths of light through the light-transmitting substrate and through the surface defects into the vacuum chamber so as to activate the mercury vapor and deposit the depositing material or a decomposition product of it in the defects, thereby blocking further passage of light through the defects.

22. The method of claim 21 in which the depositing material is selected from the group consisting of silane and germane.

23. The method of claim 21 in which the light-transmitting substrate comprises quartz.

24. The method of claim 23 in which the light is ultraviolet light.

25. The method of claim 24 in which the semiconductive film comprises amorphous silicon.

26. The method of claim 25 in which the vacuum chamber is maintained at a pressure of about 10 torr to about 40 torr.

27. The method of claim 26 in which the semiconductive film is deposited by plasma deposition.

* * * * *